United States Patent
Bronner et al.

(10) Patent No.: US 6,727,141 B1
(45) Date of Patent: Apr. 27, 2004

(54) DRAM HAVING OFFSET VERTICAL TRANSISTORS AND METHOD

(75) Inventors: Gary B. Bronner, Stormville, NY (US); Ramachandra Divakaruni, Ossining, NY (US); Byeong Kim, LaGrangeville, NY (US); Jack A. Mandelman, Flat Rock, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/342,419

(22) Filed: Jan. 14, 2003

(51) Int. Cl.$^7$ .......................... H01L 21/8242
(52) U.S. Cl. .................. 438/242; 438/239; 438/240; 438/241; 438/243; 257/301; 257/302
(58) Field of Search ................. 438/239, 240, 438/241, 242, 243, 244, 386, 387, 270, 268; 257/301, 302

(56) References Cited

U.S. PATENT DOCUMENTS

| | | | |
|---|---|---|---|
| 6,172,390 B1 * | 1/2001 | Rupp et al. ................. 257/302 |
| 6,255,683 B1 * | 7/2001 | Radens et al. .............. 257/301 |
| 6,391,705 B1 * | 5/2002 | Hsiao et al. ................ 438/243 |
| 6,515,327 B1 * | 2/2003 | King .......................... 257/304 |
| 6,566,190 B2 * | 5/2003 | Lee et al. ................... 438/242 |
| 2003/0062562 A1 * | 4/2003 | Goebel et al. ............. 257/302 |
| 2003/0132438 A1 * | 7/2003 | Jang .......................... 257/68 |
| 2003/0181016 A1 * | 9/2003 | Shu ............................ 438/392 |

* cited by examiner

*Primary Examiner*—Long Pham
*Assistant Examiner*—Thao X. Le
(74) *Attorney, Agent, or Firm*—Steven Capella

(57) ABSTRACT

The distance between buried straps in a DRAM array of trench capacitor/vertical transistor cells is increased by offsetting adjacent cells by a vertical offset distance, so that the total distance between adjacent straps is increased without increasing the horizontal distance between cells.

12 Claims, 3 Drawing Sheets

DRAM HAVING OFFSET VERTICAL TRANSISTORS AND METHOD

TECHNICAL FIELD

The field of the invention is that of forming vertical field effect transistors, in particular, in closely packed DRAM cells, while avoiding adverse effects from the reduced distance between cells.

BACKGROUND OF THE INVENTION

As dimensions in integrated circuits shrink, new problems arise and old solutions to previous problems break down. In the particular case of DRAM arrays based on trench capacitors with vertical access transistors, a problem that has become significant is that of "back to back" buried straps.

Those skilled in the art are aware that DRAM cells based on a trench capacitor with a pass transistor formed in vertical orientation on the inner wall of the trench is very compact—present technology being an $8F^2$ cell (F being the symbol for the minimum lithographic dimension).

The trench process formation produces a compact cell because the trench process essentially trades depth for area. The trench is etched very deeply—several microns—that provides surface area for the capacitor plates that does not take up silicon real estate on the surface.

The standard structure of a trench DRAM cell makes the connection between the capacitor electrode through a conductive element referred to as a buried strap that is placed on the top surface of the center electrode of the capacitor and makes contact with the source/drain of the vertical transistor in the upper part of the trench (the source/drain being formed in the single-crystal substrate) by a diffusion that extends vertically from the capacitor to the transistor channel.

Inevitably, the diffusions also extends transversely. As distances between cells shrink, there is potential difficulty from the interaction of diffusions in adjacent cells. The buried strap process does not have some of the possibilities of flexibility in geometry that are available for DRAM cells having horizontal cells with the buried strap close to the surface, since implantation and shaping the strap horizontally by a mask are not options.

Since the buried strap has a DC voltage that is the same as the capacitor, it adds a potential source of leakage.

With the shrinking of distances between cells and the reduction in dopant concentration in the P-well (done for improved retention), it can happen that the outdiffusion and depletion region from one buried strap can extend far enough toward the adjacent cell that the substrate near the vertical transistor can be isolated from the bulk wafer substrate, becoming a floating body. As a result, the thresholds of vertical transistors become unstable and can affect DRAM cell operation by reduction of the retention time.

The retention time of a DRAM cell is very important for the operation of the DRAM system, since frequent refreshing of the cells reduces the time that is available for the main purpose of the DRAM—accessing the memory cells.

SUMMARY OF THE INVENTION

The invention relates to a DRAM array in which adjacent cells on the same bitline have buried straps that are at different levels, thus increasing the distance between the buried straps.

A feature of the invention is recessing the center electrode in alternate cells, forming buried straps alternately at different heights and forming vertical transistors having the same channel length in both types of cell, thus increasing the distance between the straps of the adjacent cells.

In another embodiment of the invention top strap conductive regions of different height are formed, with a longer strap over the lower transistor, to connect the upper electrode of the transistor to the contact formed in the top surface of the semiconductor.

In another embodiment of the invention buried straps of different vertical heights are formed, connecting to vertical transistors placed at the same height beneath the semiconductor surface.

DETAILED DESCRIPTION

Figure 1:
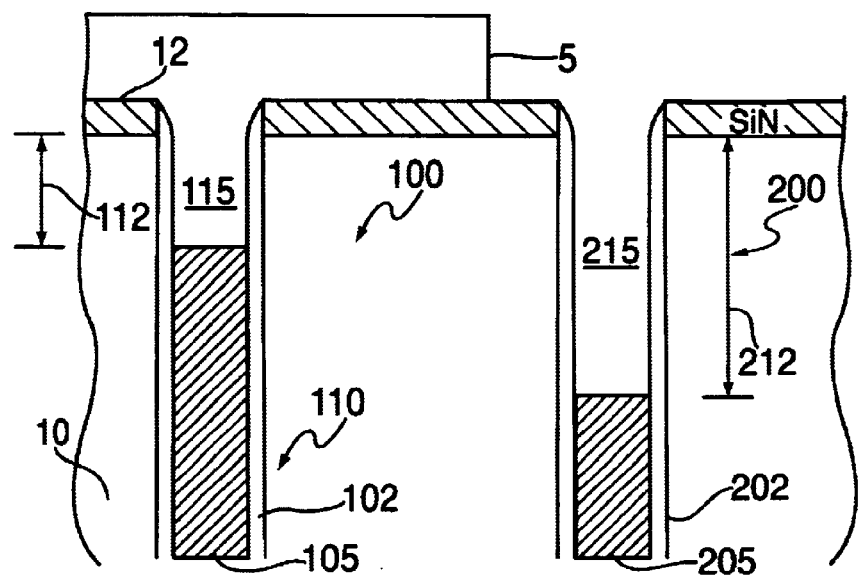
FIG. 1 shows in cross section a pair of DRAM cells on the same bitline in a first embodiment of the invention, after preliminary steps.

FIG. 1 shows cross sections of adjacent DRAM cells on the same bitline after preliminary preparatory steps in which the trench is etched by a directional etch (reactive ion etch, or RIE) that etches several microns below the surface. In the lower portion of the trench, a capacitor has been formed by lining the trench with a dielectric, such as nitride or oxide/nitride. The interior of the trench has been filled with doped polysilicon (poly) 105 that forms one electrode of the capacitor. The semiconductor substrate is the other electrode.

On the left of the Figure, cell 100 has a center electrode 105 with a top surface that is relatively close to the top surface of silicon substrate 10. On the right of the Figure, cell 200 has a similar center electrode 205 that has been recessed to a greater depth. The top surface of electrode 105 is at a height indicated by arrow 112 (nominally 300–350 nm) and the top surface of electrode 212 is at a height indicated by arrow 212, nominally 100 nm deeper (400–450 nm). A photoresist mask 5 has blocked off cell 100 during the recess step.

These cells are connected to different wordlines but share the same bitline contact. The bitline extends perpendicular to the plane of the paper and there are rows of cells in front of and behind the plane of the paper. When the voltage of one buried strap is high in an inactive cell that is not being accessed, and the next active cell is in the write mode, the depletion from both sides extends to the greatest extent and the substrate of the access transistor can be pinched off from the bulk substrate, producing the floating body. As a result, the threshold of the inactive cell can be reduced so that the charge stored in the inactive cell leaks out. As the ground rule shrinks, the distance between the two straps become smaller, resulting in aggravation of this problem of leaking the charge or in reduced charge retention. The distance between the rows in front of and behind the plane of the paper will also shrink and the designer may choose to alternate the depth of buried straps along that dimension also. It is important for proper DRAM operation to have a longer distance between each strap even with smaller ground rules.

FIG. 1 shows the two cells after conventional preliminary steps of etching the trench, forming trench dielectric in the capacitor, center electrode 105 of polysilicon (poly) and trench collar 102 of silicon dioxide, SiO2 (oxide) to isolate the capacitor from the substrate and protect the walls of the trench. Aperture 115 has been formed by recessing the poly of electrode 105 in a selective etch that attacks the collar oxide only slightly. Arrow 112 indicates the depth of the recess in cell 100 and arrow 212 indicates the corresponding deeper recess in cell 200. On the right of the figure, there are counterpart elements 205, 202 and 215. Pad nitride 12 protects the surface of wafer 10. The additional depth of recess 215, referred to as the offset distance, will be determined by the extent of the depletion region of the buried straps of the two cells and their outdiffusion.

Figure 2:
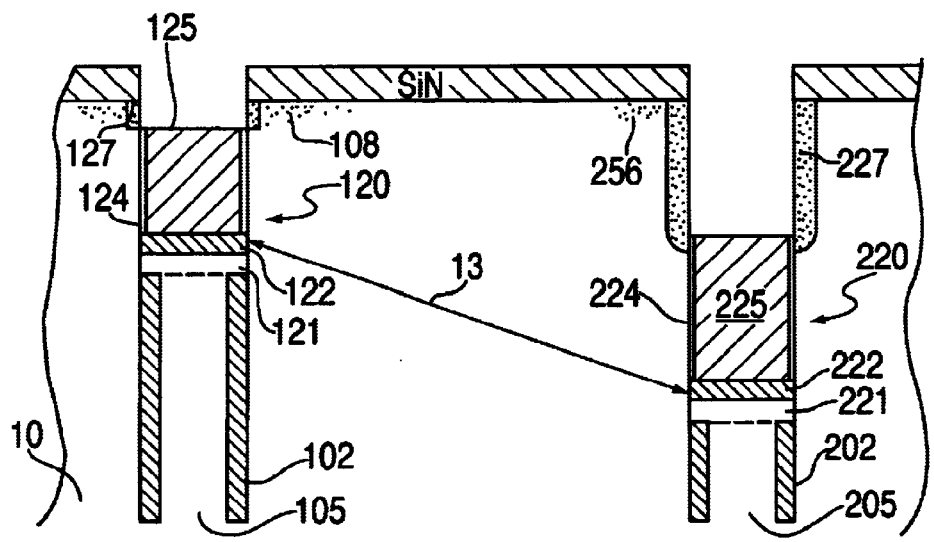
FIG. 2 shows the same cells after the simultaneous formation of buried straps.

Next, the result of which is shown in FIG. 2, resist 5 is stripped and a buried strap 121, 221 and an insulating layer of trench top oxide (or equivalent insulator) 122, 222 that separates the capacitor electrodes 105 and 205 from the gate electrode of transistors 120, 220 are formed simultaneously by conventional processes. Typically, the buried strap will be formed by stripping the collar to expose the trench walls and depositing a layer of poly with a non-conformal process, so that a layer of poly is formed in the bottom of the aperture, touching the trench walls and relatively little adheres to the upper portion of the trench walls. A layer of nitride may be put down in the upper portion to protect the area that will be the transistor channel. The insulating layer of trench top oxide will be put down similarly. Since the buried strap/TTO combinations are formed simultaneously, they have the same vertical extent (channel length).

Figure 3:
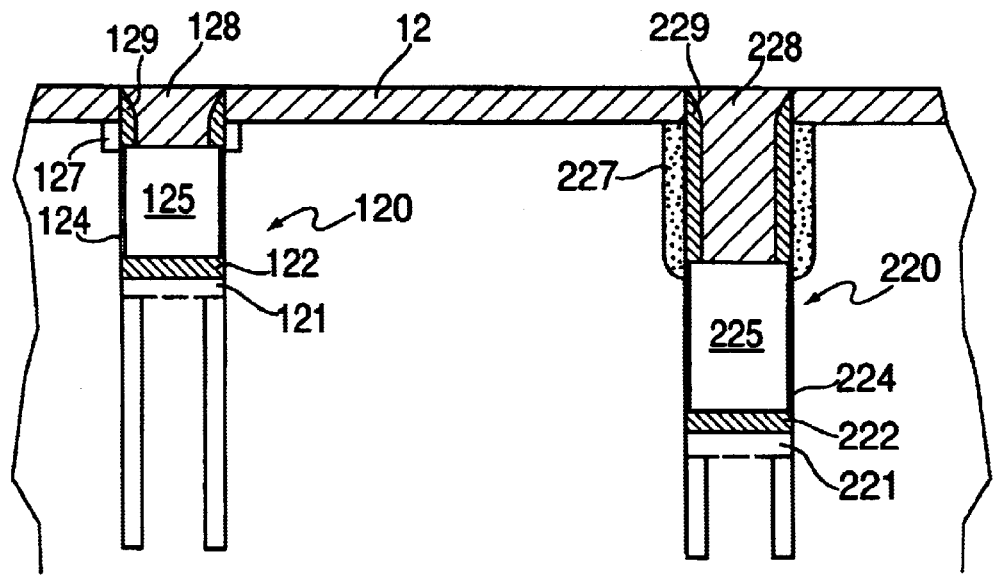
FIG. 3 shows the completed cells.

Transistors (without upper source/drain) 120 and 220 are formed, having gate oxide 124 and 224 and gate poly 125 and 225. An array top poly recess is performed (nominally 60 nm). Above transistor 120, a doped area 127 is formed by gas phase doping to establish a conductive path (source/drain) from the body of transistor 120 in the single-crystal silicon and the horizontal areas 108, 256 at the surface of substrate 10 that will contain the upper electrode of transistors 120, 220 and make contact with the bitline (to be formed later). Sidewalls 129 and 229 in FIG. 3 isolate the source/drain of vertical transistors 120, 220 from the gate electrode (128, 228) of the same transistor. Before the gas phase doping step, a second resist mask 5 is put down and a second poly recess is performed on cell 200 to recess it by the same offset distance so that the channel lengths of both transistors are same. After the second recess, resist 5 is stripped and the GPD step dopes the exposed silicon sidewalls above the transistors to form the self-aligned junctions 127 and 227.

Arrow 13 in FIG. 2 illustrates the distance between buried strap 121 and buried strap 221. Since the two buried straps are at different levels, the diagonal distance between each strap is longer compared to the case of straps on the same level. As the distance between each trench becomes smaller, the effect of the diagonal distance increase from the off-set straps becomes more significant.

Referring to FIG. 3, insulator sidewall spacers 129 and 229 have been formed above the gates 125 and 225 and a poly deposition step has been performed to fill in the apertures and provide gate contacts 128 and 228. Conventional processing will then continue for the completion of array cell and support transistors, including appropriate circuitry and/or logic modules in the case of embedded DRAM arrays.

Another embodiment of the invention also achieves the goal of having the buried straps offset vertically by a different method in which the buried strap of the cell having the extra recess step is made longer by the offset distance with which the center electrode is recessed, so that the two transistors are formed at the same height with only one additional resist masking layer and recess RIE process.

Figure 4:
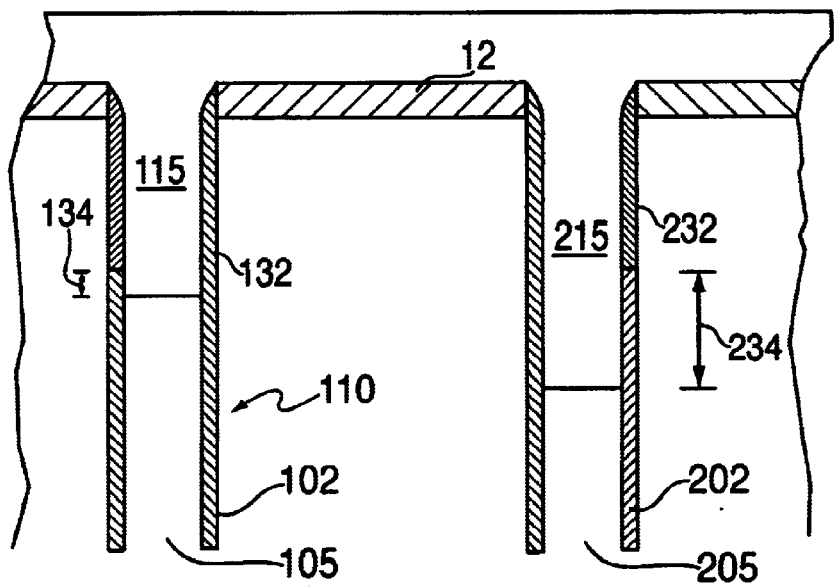
FIG. 4 shows in cross section a pair of DRAM cells in a second embodiment of the invention.

Referring to FIG. 4, the preliminary steps through the step of recessing center electrode 105 and 205 are the same as in the first embodiment. Nitride spacers 132 and 232 have been formed, following collar oxide removal, on the sidewalls of apertures 115 and 215 before the step of electrode recess, so that the spacers extend down to the same height that will define bottom of both vertical transistors channel at same level. A first electrode recess has been performed on both cells 100 and 200, producing a recess denoted by arrow 134 in cell 100. The resist block mask is put down and a second electrode recess is performed on electrode 205, producing a recess denoted by arrow 234. The depth of recess at this step is the amount of off-set.

After the steps shown in FIG. 4, a collar wet etch removes oxide collars 102 and 202 in the recessed area, exposing the silicon sidewalls (aperture 215 having sidewalls exposed additionally by the offset distance).

Figure 5:
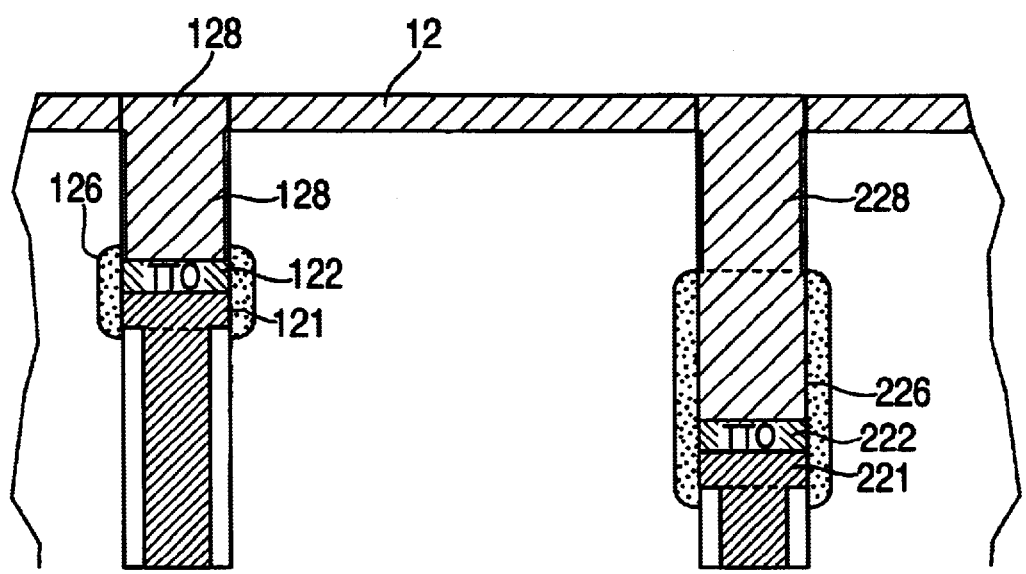
FIG. 5 shows the completed cells of the second embodiment.

Buried straps 126 and 226 are formed by deposition of a poly layer followed by poly etchback (121 and 221). It is noteworthy that the buried strap does not connect to the channel of vertical transistor due to recess steps in this embodiment. The gaps between buried strap and channel for both cells in FIG. 5 are doped with gas phase doping, instead of by out-diffusion of the buried strap, resulting in a reduced amount of dopant lateral out-diffusion. This reduced out diffusion, as well as the advantage of the off-set that is provided by gas phase doping of bottom source/drain of vertical transistor, is an additional advantage of this embodiment. One skilled in the art would expect that the greater extent of the longer buried straps on the right side and the inevitable greater leakage for that greater area would be a drawback. A thermal oxide is grown on the surface of the gas phase doped surface selectively, following conventional TTO formation. Nitride spacer (132, 232) is stripped and the gate oxide is formed on the newly cleaned silicon sidewalls.

Poly is put down for the transistor gates. On the right, the poly in the lower portion of the structure, below the gate oxide and adjacent to buried strap extensions 226, will not contribute to the current path into buried strap 221 because of the oxide on the trench sidewalls. The doped areas 226 created during the gas phase doping step is a part of source/drain of vertical transistor and will carry the current.

Processing steps to complete cell array and to form the support and/or logic transistors with appropriate circuitry for DRAM/eDRAM operation will be standard.

While the invention has been described in terms of a single preferred embodiment, those skilled in the art will recognize that the invention can be practiced in various versions within the spirit and scope of the following claims.

What is claimed is:

1. A method of making a DRAM array having cells containing trench capacitors and vertical access transistors comprising the steps of:

preparing a semiconductor substrate;

forming a set of trenches in said substrate;

forming a set of capacitors within said set of trenches, members of said set of capacitors having an interior electrode with a top surface;

recessing a first subset of said interior electrodes in a first subset of cells with a top surface to a first depth;

recessing a second subset of said interior electrodes in a second subset of cells with a top surface to a second depth greater than said first depth by an offset amount, individual members of said second subset being located adjacent to individual members of said first subset;

forming vertical transistors in each of said first subset and said second subset, whereby the distance between adjacent top surfaces in adjacent ones of said first and second subsets is increased by an amount dependent on said offset amount; and connecting said first and second subsets of cells to form said DRAM array.

2. A method according to claim 1, in which said vertical transistors in said first and second subsets are formed simultaneously at vertical locations differing by said offset amount, whereby transistors in said first and second subsets of cells have substantially the same vertical extent at different vertical positions;

cells in said first and second subsets are filled with gate conductive material simultaneously;

a second recess is performed only on gate conductive material in said second subset, whereby a top surface of said vertical transistors in said second subset is lower by said offset distance than a corresponding top surface of said vertical transistors in said first subset;

self-aligned junctions are formed simultaneously in said first and second subsets of cells above said vertical transistors, whereby cells in said second subset have junctions with a greater height than corresponding junctions in said first subset.

3. A method according to claim 2, in which said self-aligned junctions are formed in said semiconductor substrate above said vertical transistors by gas phase doping.

4. A method according to claim 2, in which a buried strap and trench top insulator are formed simultaneously in said first and second subsets simultaneously, whereby said first and second subsets have a top surface of said trench top insulator at vertical positions differing by said offset distance.

5. A method according to claim 3, in which a buried strap and trench top insulator are formed simultaneously in said first and second subsets simultaneously, whereby said first and second subsets have a top surface of said trench top insulator at vertical positions differing by said offset distance.

6. A method according to claim 2, in which said self-aligned junctions in both said first and second subsets extend from a top edge of said vertical transistors to a surface of said substrate.

7. A method according to claim 3, in which said self-aligned junctions in both said first and second subsets extend from a top edge of said vertical transistors to a surface of said substrate.

8. A method according to claim 4, in which said self-aligned junctions in both said first and second subsets extend from a top edge of said vertical transistors to a surface of said substrate.

9. A method according to claim 5, in which said self-aligned junctions in both said first and second subsets extend from a top edge of said vertical transistors to a surface of said substrate.

10. A method according to claim 1, in which a first recess step is performed in both said subsets;

a second recess step is performed only on said second subset, whereby said center electrodes in said second subset are recessed below corresponding top surfaces in said first subset by said offset distance;

a gas phase doping step, a buried strap formation step and a trench top insulator step are performed on both subsets above said center electrodes, whereby both subsets have buried straps and insulators, those in said second subset being greater in vertical extent by said offset distance than those in said first subset;

gate insulators and gate electrodes are formed simultaneously in said first and second subsets at the same vertical position, whereby transistors in said first and second subsets of cells are located at substantially the same height.

11. A method according to claim 10, in which nitride sidewalls are formed on the trench walls after the center electrodes of both subsets have been recessed;

a wet etch removes the trench oxide collar in the area between the recessed center electrodes and the bottom of the nitride sidewalls;

a gas phase doping step forms extended transistor electrodes in the substrate below the nitride sidewalls;

a buried strap is formed to connect the center electrodes with the extended transistor electrodes; and a trench top insulator isolates the buried strap from the upper portion of the trench.

12. A method according to claim 11, in which a thermal oxide is grown on the exposed trench walls below the nitride sidewalls before the nitride sidewalls are stripped, whereby the extended transistor electrodes are insulated from the gate electrode; and the nitride sidewalls in both subsets are stripped and gate insulators and gate conductors are formed, whereby said second subset has extended lower transistor electrodes greater by said offset distance than said first subset and said first and second subsets have vertical transistors at substantially the same height.

* * * * *